(12) United States Patent
Kimoto et al.

(10) Patent No.: US 6,576,971 B2
(45) Date of Patent: *Jun. 10, 2003

(54) CHIP TYPE ELECTRONIC PART

(75) Inventors: Hidenobu Kimoto, Yokaichi (JP);
Masahiko Kawase, Yokaichi (JP);
Norimitsu Kitoh, Omihachiman (JP)

(73) Assignee: Murata Manufacturing Co., Ltd., Nagaokakyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/320,661

(22) Filed: May 27, 1999

(65) Prior Publication Data

US 2002/0005588 A1 Jan. 17, 2002

(30) Foreign Application Priority Data

May 28, 1998 (JP) ............................................. 10-147351

(51) Int. Cl.$^7$ ............................................... H01L 23/48
(52) U.S. Cl. .......................... 257/467; 257/772; 257/779
(58) Field of Search ................................. 257/467, 468, 257/469, 470, 772, 779, 780, 781, 784

(56) References Cited

U.S. PATENT DOCUMENTS 5,508,562 A * 4/1996 Horie et al. ................. 257/772
5,550,407 A * 8/1996 Ogashiwa .................... 257/772
5,569,880 A * 10/1996 Galvagni et al. ........... 257/686

FOREIGN PATENT DOCUMENTS

JP   550821   12/2001

* cited by examiner

Primary Examiner—David L. Talbott
Assistant Examiner—Lourdes Cruz
(74) Attorney, Agent, or Firm—Burns, Doane, Swecker & Mathis, LLP

(57) ABSTRACT

The present invention is to provide a chip type electronic part without the risk of generating a tombstone at the time of soldering on a circuit substrate. External electrodes are formed at both end parts of an electronic part element, with the external electrodes comprising electrodes at the base layer formed as a thin film and solders at the outermost layer, with the solders at the outermost layer containing Sn and Pb as the main component and 0.1 to 0.4% by weight of Ag.

17 Claims, 1 Drawing Sheet

CHIP TYPE ELECTRONIC PART

This application corresponds to Japanese Patent Application No. 10-147351, filed on May 28, 1998, which is hereby incorporated by reference in its entirety.

BACKGROUND OF THE INVENTION

1. Field of the Invention

The present invention relates to a chip type electronic part to be mounted on a circuit substrate, more specifically to a chip type electronic part characterized in a solder to be used in an external electrode of the electronic part.

2. Description of the Related Art

A mounting step for soldering a chip type electronic part onto a circuit substrate is conducted as follows. That is, so-called reflow soldering is conducted by placing a chip type electronic part having an external electrode comprising a solder at the outermost layer on a cream solder applied on a circuit pattern of a circuit substrate, heating the chip type electronic part and the circuit substrate in a reflow furnace in this state so as to melt the solder of the external electrode and the cream solder of the circuit substrate, and cooling off for jointing the chip type electronic part with the circuit substrate.

However, in the above-mentioned jointing method, a chip standing failure called tombstone can be generated. The causes for generating such a chip standing failure include the followings.

(1) Change in the set temperature of the reflow furnace.

(2) Unevenness in the solderability caused by dirt of the external electrode of the chip type electronic part.

(3) Difference of the melting rates of the solders used in the external electrode and the circuit substrate of the chip type electronic part according to the composition difference of each solder.

SUMMARY OF THE INVENTION

An object of the present invention is to provide a chip type electronic part without the risk of generating a tombstone at the time of being mounted onto a circuit substrate.

A chip type electronic part according to the present invention comprises an electronic part element provided with external electrodes at both end parts thereof. The external electrodes comprise an electrode at the base layer formed as a thin film, and a solder at the outermost layer. The solder at the outermost layer contains Sn and Pb as the main component and 0.1 to 0.4% by weight of Ag.

In the chip type electronic part according to the present invention, the solid phase point of the above-mentioned solder at the outermost layer is lower by up to $-2°$ C. than, the same as, or higher than the solid phase point of a cream solder to be used in a circuit substrate for mounting.

Accordingly, a chip type electronic part without the risk of generating a tombstone at the time of mounting the chip type electronic part on a circuit substrate can be obtained.

DESCRIPTION OF THE PREFERRED EMBODIMENT

Figure 1:
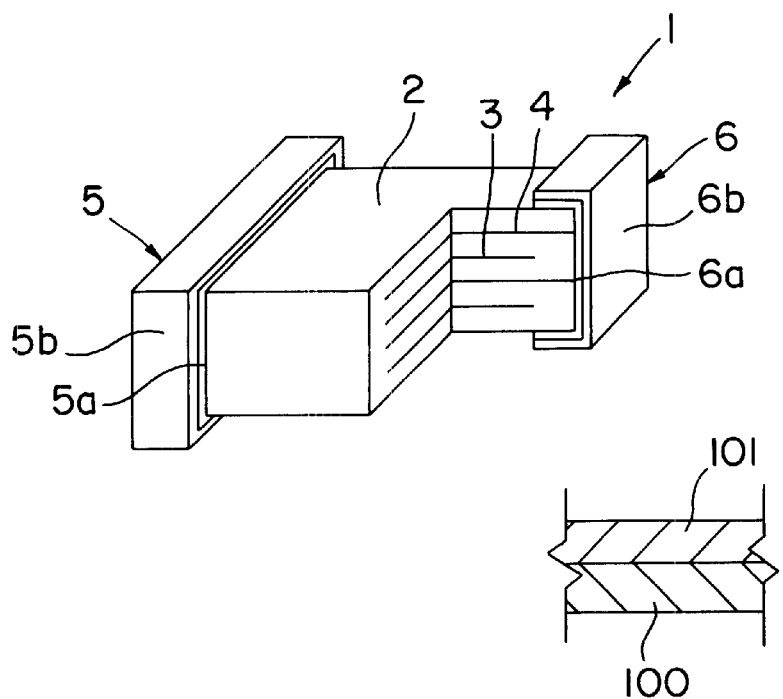
FIG. 1 is a cross-sectional view of a chip type thermistor according to one embodiment of the present invention.

An embodiment of the present invention will be explained in detail with reference to the chip type thermistor shown in FIG. 1.

The chip type thermistor 1 comprises a thermistor element 2 with internal electrodes 3, 4 formed inside thereof, and external electrodes 5, 6 formed at both end parts of the thermistor element 2.

The thermistor element 2 can be obtained as follows. By adding a predetermined amount of an organic binder, a dispersant, a surfactant, an antifoamer and water to a thermistor material comprising a plurality of ceramic oxides, such as Mn, Ni, Co, or the like, a 50 to 60 $\mu$m green sheet is produced. Then, by screen printing a paste for an internal electrode comprising Ag, Ag—Pd, Pt, or the like onto the green sheet cut in a predetermined size, a green sheet for an internal layer is produced. With a predetermined number of the green sheets for an internal layer laminated and green sheets for an outer layer not provided with the internal electrodes 3, 4 superimposed above and below thereof, they are pressed and integrated by a hydraulic presser so as to have a predetermined thickness. Furthermore, the pressed product is cut into a predetermined chip shape and baked so as to provide a thermistor element 2.

By forming the external electrodes 5, 6 to be connected electrically with the internal electrodes 3, 4 at both end parts of the thermistor element 2, a chip type thermistor 1 is obtained.

Figure 2:
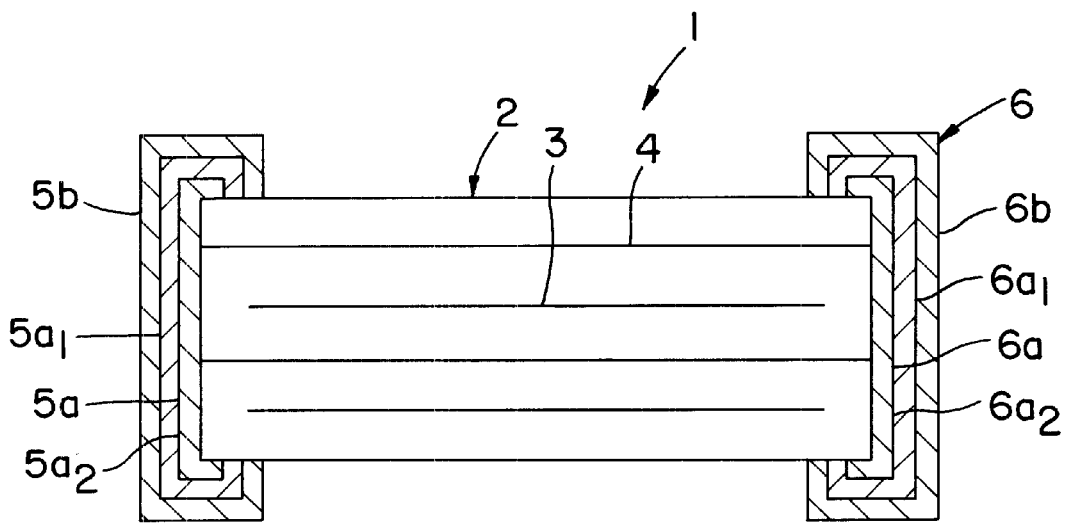
FIG. 2 is a cross-sectional view of a portion of a thermistor element with an external electrode according to an embodiment the present invention.

As seen in FIG. 2, the external electrodes 5, 6, preferably comprise base layers 5a, 6a including a thin film electrode $5a_2$, $6a_2$ comprising Cr or Ni formed by a sputtering process and a thin film electrode $5a_1$, $6a_1$ made from Ag, and outermost layers 5b, 6b comprising a solder containing Sn and Pb as the main component and Ag.

The outermost layers 5b, 6b are provided by preparing molten solders with 5 kinds of compositions including a solder containing Sn and Pb as the main component and 0.1 to 1.0% by weight of Ag as shown in Table 1, and coating the molten solders onto the base layers 5a, 6a by a solder dip process.

Since the Ag in the Ag thin film electrode of the base layers 5a, 6a diffuses at the time of solder dipping, the composition of the above-mentioned molten solders needs to be set in view of the Ag diffusion from the Ag thin film electrode of the base layers 5a, 6a.

TABLE 1

| solder composition ratio of the external electrode (% by weight) | solid phase point |
| --- | --- |
| (1) Sn 60/Pb 39.9/Ag 0.1 | 183° C. |
| (2) Sn 60/Pb 39.8/Ag 0.2 | 182° C. |
| (3) Sn 60/Pb 39.6/Ag 0.4 | 181° C. |
| (4) Sn 60/Pb 39.2/Ag 0.8 | 178° C. |
| (5) Sn 60/Pb 39.0/Ag 1.0 | 177° C. |

Then, in order to mount the chip type thermistors 1 having the above-mentioned 5 kinds of external electrodes 5, 6, circuit substrates 100 applied with 6 kinds of cream solders 101 containing Sn and Pb as the main component as shown in Table 2 were prepared. The cream solders used herein are ordinary solders containing Sn and Pb as the main component and 0 to 3.5% by weight of Ag.

TABLE 2

| cream solder composition ratio to be applied on the circuit substrate (% by weight) | solid phase point |
| --- | --- |
| (1) Sn 60/Pb 40 | 183° C. |
| (2) Sn 63/Pb 37 | 183° C. |
| (3) Sn 62/Pb 37/Ag 1 | 179° C. |
| (4) Sn 62/Pb 36/Ag 2 | 176° C. |
| (5) Sn 60/Pb 36.5/Ag 3.5 | 176° C. |
| (6) Sn 57/Pb 38/Ag 2/Bi 3 | 173° C. |

The above-mentioned 5 kinds of the chip type thermistors 1 were mounted onto the circuit substrates applied with the above-mentioned 6 kinds of the cream solders in various combinations. The tombstone generation ratio in total 10,000 pieces of the mounted chip type thermistors 1 was inspected. Results are shown in Table 3.

TABLE 3

(Unit %)

|  |  | composition of the solder of the external electrode | | | | |
| --- | --- | --- | --- | --- | --- | --- |
|  |  | (1) | (2) | (3) | (4) | (5) |
| composition of the cream solder | (1) | 0 | 0 | 0 | 0.5 | 0.5 |
|  | (2) | 0 | 0 | 0 | 0.4 | 0.3 |
|  | (3) | 0 | 0 | 0 | 0.1 | 0.2 |
|  | (4) | 0 | 0 | 0 | 0 | 0 |
|  | (5) | 0 | 0 | 0 | 0 | 0 |
|  | (6) | 0 | 0 | 0 | 0 | 0 |

First, each solid phase point and the generation ratio of the tombstone will be compared and discussed for the solder of the external electrode of the chip type thermistor and the cream solder applied on the circuit substrate.

As shown in Table 3, with the solders of the external electrode of the chip type thermistor (1), (2), (3), regardless of the composition of the cream solder applied on the circuit substrate, a tombstone was not generated. The solid phase point of the solder of the external electrode was lower by up to −2° C. than, the same as, or higher than the solid phase point of the cream solder applied on the circuit substrate. On the other hand, with the solders of the external electrode of the chip type thermistor (4), (5), a tombstone was not generated only when the solid phase point of the solder of the external electrode is higher than the solid phase point of the cream solder applied on the circuit substrate.

In order to prevent the generation of the tombstone, it is preferable that the timing of melting the solder in the reflow soldering is such that the solder at the circuit substrate side is melted earlier than the solder at the external electrode side, that is, the solid phase point of the solder of the external electrode of the chip type thermistor is higher than that of the cream solder applied on the circuit substrate. This is because if the solder at the external electrode side is melted earlier, the chip type electronic part cannot sway on the circuit substrate and thus the dislocation cannot be corrected with respect to a predetermined position, whereas if the solder at the circuit substrate side is melted earlier, the chip type electronic part is raised to be in the unstable state, and thus the dislocation can be corrected automatically for preventing the generation of the tombstone caused by the dislocation at the time of mounting the chip type electronic part.

The reason why a tombstone was not generated in the cases of the solders of the external electrode (1), (2), (3) even when the solid phase point of the solder at the external electrode is lower by −2° C. than or the same as the solid phase point of the cream solder applied on the circuit substrate is that since the solid phase point is the state wherein the solid and the liquid are mixed and thus has a wide temperature range, even if the solder at the external electrode side is melted earlier by the degree corresponding to about 2° C., the solder at the circuit substrate is melted soon as well.

Then, the Ag content and the solid phase point of the solder of the external electrode of the chip type thermistor and the generation ratio of the tombstone will be compared and discussed.

As apparent from Table 1, the more the Ag content of the solder of the external electrode, the lower the solid phase point of the solder of the external electrode is.

Moreover, as shown in Table 3, in the cases of the solders of the external electrode with a 0.1 to 0.4% by weight of the Ag content (1), (2), (3), a tombstone was not generated, whereas in the cases of the solders of the external electrode with a more than 0.4% by weight of Ag content (4), (5), a tombstone was generated when the solid phase point of the solder of the external electrode is lower than the solid phase point of the cream solder at the circuit substrate side.

By adding about 0.1% by weight of Ag to a solder containing Sn and Pb as the main component, the solder can spread well so that the fixation strength between the chip type electronic part and the circuit substrate is improved as well as the effect of preventing the electrode diffusion can be provided in the base layers 5a, 6a of the external electrodes 5, 6. On the other hand, with a more than 0.4% by weight Ag content in the solder of the external electrode, the solid phase point of the solder of the external electrode is lowered so that the solder of the external electrode is melted earlier than the cream solder at the circuit substrate side and the tombstone can be generated, and thus it is not preferable.

The solders of the external electrode of the chip type thermistor (1), (2), (3) are more preferable than the solders of the external electrode of the chip type thermistor (4), (5) in terms of the practical use for having a broader range in selecting the cream solders to be applied on the circuit substrate (1) to (6).

The chip type electronic part according to the present invention is not limited to the ceramic thermistor of the above-mentioned embodiment, but can be applied also in chip type ceramic electronic parts, such as a positive characteristic thermistor, a varistor, a solid resistor, a capacitor, an inductor, or the like.

Moreover, although an embodiment with the base layers 5a, 6a of the external electrodes 5, 6 comprising two layers including a thin film electrode 5a$_2$, 6a$_2$ made from Cr or Ni and a thin film electrode 5a$_1$, 6a$_1$ made from Ag provided thereon has been explained and shown in FIG. 2, according to the composition of the electronic part element, the material of the electrode of the lower layer fo the base layer can be changed, or the base layers 5a, 6a may comprise one layer without having the Ag upper layer of the base layer optionally.

As heretofore mentioned, since a chip type electronic part according to the present invention uses a solder containing Sn and Pb as the main component and 0.1 to 0.4% by weight of Ag in an external electrode, generation of tombstone can be prevented at the time of mounting on a circuit substrate.

What is claimed is:

1. A chip type electronic part comprising
   an electronic part element having opposite ends, the opposite ends of the electronic part element facing in different directions, and external electrodes, an external electrode being disposed at each of the opposite ends of the electronic part element, each external electrode having a base layer, the base layer being formed as a thin film, and a solder defining an outermost layer of the external electrode, with the solder containing Sn and Pb as main components and 0.1 to 0.4% by weight of Ag, wherein, for each external electrode, the base layer entirely covers and directly contacts all of at least one end of the opposite ends of the electronic part element, and the solder is in direct contact with and covers at least a portion of the base layer covering the at least one end of the electronic part element.

2. The chip type electronic part according to claim 1, wherein the chip type electronic part is intended to be bonded to a circuit substrate by a cream solder containing Sn and Pb as main components, and having 0 to 3.5% by weight of Ag, and a solid phase point of the solder at the outermost layer is lower by up to −2° C. than, the same as, or higher than a solid phase point of the cream solder to be used in the circuit substrate for mounting.

3. The chip type electronic part according to claim 1, wherein the electronic part element includes internal electrodes electrically connected to the base layer.

4. The chip type electronic part according to claim 1, wherein the base layer includes a thin film electrode comprising Cr or Ni.

5. The chip type electronic part according to claim 4, wherein the thin film electrode is a sputtered thin film.

6. The chip type electronic part according to claim 5, wherein the base layer includes a layer made from Ag.

7. The chip type electronic part according to claim 6, wherein the Ag in the outermost layer is at least partially comprised of Ag diffused into the solder from the base layer.

8. The chip type electronic part according to claim 4, wherein the base layer includes a layer made from Ag.

9. The chip type electronic part according to claim 8, wherein the Ag in the outermost layer is at least partially comprised of Ag diffused into the solder from the base layer.

10. The chip type electronic part according to claim 1, wherein the base layer includes a layer made from Ag.

11. The chip type electronic part according to claim 10, wherein the Ag in the outermost layer is at least partially comprised of Ag diffused into the solder from the base layer.

12. A circuit substrate mounting comprising:

a substrate:

a chip type electronic part comprising an electronic part element provided with external electrodes at end parts thereof, the external electrodes comprising an electrode, the electrode having a base layer, the base layer being formed as a thin film and being in direct contact with all of the end parts of the element, and a solder at an outermost layer in direct contact with the base layer, with the solder at the outermost layer containing Sn and Pb as main components and 0.1 to 0.4% by weight of Ag;

a cream solder for bonding the electronic part to the substrate, wherein a solid phase point of the solder at the outermost layer is lower by up to −2° C. than, the same as, or higher than a solid phase point of the cream solder.

13. The circuit substrate mounting according to claim 12, wherein the electronic part element includes internal electrodes electrically connected to the base layer.

14. The circuit substrate mounting according to claim 12, wherein the wherein the base layer includes a thin film electrode comprising Cr or Ni.

15. The circuit substrate mounting according to claim 14, wherein the thin film electrode is a sputtered thin film.

16. The circuit substrate mounting according to claim 12, wherein the base layer includes a layer made from Ag.

17. The circuit substrate mounting according to claim 16, wherein the Ag in the outermost layer is at least partially comprised of Ag diffused into the solder from the base layer.

* * * * *